United States Patent [19]

Higgins, Jr. et al.

[11] Patent Number: 5,093,636

[45] Date of Patent: Mar. 3, 1992

[54] PHASE BASED VECTOR MODULATOR

[75] Inventors: Thomas M. Higgins, Jr.; Marcus K. DaSilva; Robert J. Conley, all of Spokane, Wash.

[73] Assignee: Hewlett-Packard Company, Palo Alto, Calif.

[21] Appl. No.: 588,632

[22] Filed: Sep. 25, 1990

[51] Int. Cl.⁵ .................... H03C 1/00; H03C 3/00
[52] U.S. Cl. .................... 332/100; 332/103; 332/119; 332/127; 332/144; 332/151
[58] Field of Search ............... 332/100–105, 332/108, 119, 120, 127, 128, 144, 145, 151; 375/35, 62, 66, 67; 455/42, 102, 110

[56] References Cited

U.S. PATENT DOCUMENTS

| | | | |
|---|---|---|---|
| 3,100,890 | 8/1963 | Henning | 332/104 X |
| 3,777,275 | 12/1973 | Cox | 330/10 |
| 3,909,742 | 9/1975 | Cox et al. | 330/84 |
| 3,927,379 | 12/1975 | Cox et al. | 330/10 |
| 4,006,418 | 2/1977 | Liskov et al. | 332/103 X |
| 4,178,557 | 12/1979 | Henry | 330/10 |
| 4,216,542 | 8/1980 | Hermesmeyer | 332/103 X |
| 4,546,331 | 10/1985 | DaSilva et al. | 332/128 |
| 4,571,549 | 2/1986 | Lods et al. | 332/103 |
| 4,843,351 | 6/1989 | Edwards et al. | 332/103 |
| 4,930,141 | 5/1990 | Ohmagari | 332/103 X |
| 4,970,519 | 11/1990 | Minnis et al. | 342/165 |

OTHER PUBLICATIONS

Casadevall, "The LINC Transmitter", RF Design, Feb. 1990, pp. 41–48.
DaSilva, "Synthesis of FM Signals by Phase Reconstruction in a Phase-Locked Loop", Hewlett-Packard, Spokane Division, May 23, 1984.

*Primary Examiner*—Siegfried H. Grimm

[57] ABSTRACT

Vector modulation is effected by summing output signals from two phase modulators. The lack of amplitude modulation on the signals when summed permits non-linear processing of the signals, such as PLL frequency translation. In one embodiment, the phase modulators comprise fractional-N phase locked loops modulated with digital data words. In another, the phase modulators comprise direct digital synthesizers.

17 Claims, 3 Drawing Sheets

PHASE BASED VECTOR MODULATOR

FIELD OF THE INVENTION

The present invention relates to modulation systems, and more particularly relates to a novel vector modulation system employing phase modulators.

BACKGROUND AND SUMMARY OF THE INVENTION

Vector modulation refers to a modulation technique in which the modulated signal can have arbitrary phase and amplitude relationships. Vector modulation is desirable in many instances, one of which is the transmission of digital information on RF carriers. One popular example of a vector modulator is an "I-Q modulator." In an I-Q modulator, the modulation signal is divided into an in-phase (I) and a quadrature (Q) component. These form the basis of two orthogonal signals that can be added together to form any combination of magnitude and phase. It is thus theoretically possible to use an I-Q modulator to generate any form of amplitude, phase or frequency modulation, or any combination thereof.

FIG. 1 illustrates a conventional I-Q modulator 10 which includes an L.O. source 12, a 90 degree phase shift network 14, first and second mixers 16a, 16b, and a summing network 18. The mixers are used as amplitude modulators. A first input modulation signal I is mixed by the first mixer 16a with the L.O. signal. A second modulation signal Q is mixed by the second mixer 16b with the L.O. signal shifted by 90 degrees. The two amplitude modulated signals are then summed together by network 18, resulting in an output signal whose amplitude and phase modulation can be described as the vector sum of the "in phase" signal I and "quadrature phase" signal Q. A mathematical description follows. Let the L.O. signal be given by:

$$V_{LO} = e^{jwt} \quad (1)$$

$$V_1 = I\, e^{jwt} \quad (2)$$

$$V_2 = Q\, e^{j(wt + \pi/2)} \quad (3)$$

The output signal can then be given by:

$$V_1 + V_2 = (I + jQ)e^{jwt} \quad (4)$$

It will be recognized that the circuit of FIG. 1 can produce an output signal having an arbitrary amplitude and an arbitrary phase relationship with the L.O. signal. If I and Q are sinusoidal signals whose phases differ by 90 degrees, one of the sidebands generated by the upper mixer is cancelled by a sideband generated in the lower mixer. When used in this way, the circuit operates as a single-sideband mixer.

A drawback to the illustrated system is that phase and amplitude accuracy must be maintained in both signal paths. However, it is sometimes desirable to process these signals using circuitry that alters these characteristics. Such processing interferes with the resulting modulation. An example of such processing is frequency translation of the two component signals in a tracking filter that uses phase locked loops (PLLs). In such circuits, the phase locked loops generally remove the amplitude modulation from the component signals, making this frequency translation method only useful when the signals have constant amplitude. This is generally not the case.

In accordance with the present invention, this and other drawbacks of prior art vector modulation techniques are overcome by combining constant amplitude signals from phase modulators, rather than amplitude modulators or mixers, in producing the vector modulated output signal. Since the two component phase modulated signals have no amplitude modulation, they can be processed without regard to effect on the signals' amplitudes. Any change in their relative amplitudes can be corrected by a level control circuit prior to summing. This flexibility permits implementation of circuits, such as PLL-based tracking filters, that could not be realized using prior art vector modulation techniques.

The foregoing and additional features and advantages of the present invention will be more readily apparent from the following detailed description, which proceeds with reference to the accompanying drawings.

DETAILED DESCRIPTION

Figure 1:
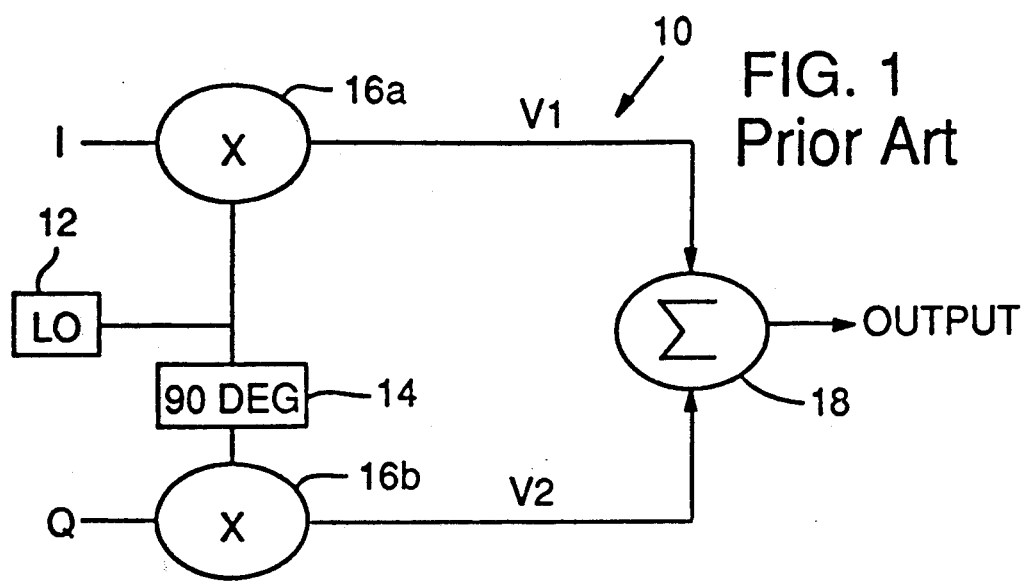
FIG. 1 is a block diagram of a conventional I-Q modulator.
Figure 2:
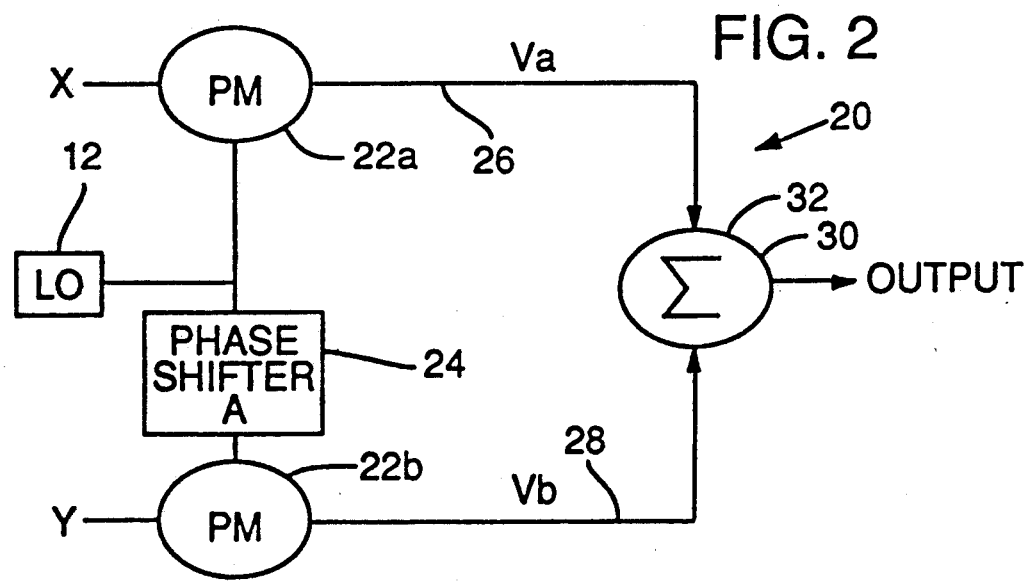
FIG. 2 is a block diagram of a phase based vector modulator in accordance with one embodiment of the present invention.

Referring now to FIG. 2, a phase based vector modulator system 20 according to one embodiment of the present invention is similar in topology to the prior art modulator 10 of FIG. 1, but substitutes phase modulators 22a, 22b for mixers (amplitude modulators) 16a, 16b. The 90 degree phase shift network 14 in the prior art modulator is replaced by a phase shift network 24 that introduces an arbitrary phase shift A. In modulator 20, the component phase modulated signals $V_a$ and $V_b$ on lines 26 and 28 have constant amplitudes but the resulting combined output signal on line 30 from the summing network 32 can have both amplitude and phase modulation.

The signals in modulator 20 can be represented mathematically as $$V_{LO} = e^{jwt} \quad (5)$$

$$V_a = e^{j(wt + X)} \quad (6)$$

$$V_b = e^{j(wt + Y + A)} \quad (7)$$

$$V_a + V_b = V_{out} = (e^{jX} + e^{j(Y+A)})e^{jwt} \quad (8)$$

$$V_{out} = (\cos X + j\sin X + \cos(Y+A) + j\sin(Y+A))e^{jwt} \quad (9)$$

$$V_{out} = \{\cos X + \cos(Y+A) + j[\sin X + \sin(Y+A)]\}e^{jwt} \quad (10)$$

If the output of the phase based vector modulator 20 is set equal to the output of the conventional I-Q modulator 10, then a mapping between the input I-Q signals of FIG. 1 and the input I-Q signals of FIG. 2 can be found:

$$I = \cos X + \cos(Y+A) \quad (11)$$

$$Q = \sin X + \sin(Y+A) \quad (12)$$

If we let $$M = SQRT(I^2+Q^2) \text{ and} \quad (13)$$

$$\theta = \tan^{-1}(Q/I) \quad (14)$$

then it can be shown that $$X = \theta - \cos^{-1}(M/2) \quad (15)$$

$$Y = \theta - A + \cos^{-1}(M/2) \quad (16)$$

As noted, the phase shift value "A" is arbitrary. However, the associated mapping transformation is simplified if A=0 or A=90 degrees. If A=0, then $$X = \theta - \cos^{-1}(M/2) \quad (17)$$

$$Y = \theta + \cos^{-1}(M/2) \quad (18)$$

If A=90 degrees, then $$X = \theta - \cos^{-1}(M/2) \quad (19)$$

$$Y = \theta - \sin^{-1}(M/2) \quad (20)$$

The foregoing derivations illustrate that a modulator that behaves like the I-Q modulator 10 of FIG. 1 can be made using phase modulators instead of amplitude modulators. The values of input signals X and Y, however, need to be functionally related to those of I and Q. From the foregoing discussion, it can be seen that this relationship is:

$$X = \tan^{-1}(Q/I) - \cos^{-1}(SQRT(I^2+Q^2)/2) \quad (21)$$

$$Y = \tan^{-1}(Q/I) - A + \cos^{-1}(SQRT(I^2+Q^2)/2) \quad (22)$$

Figure 3:
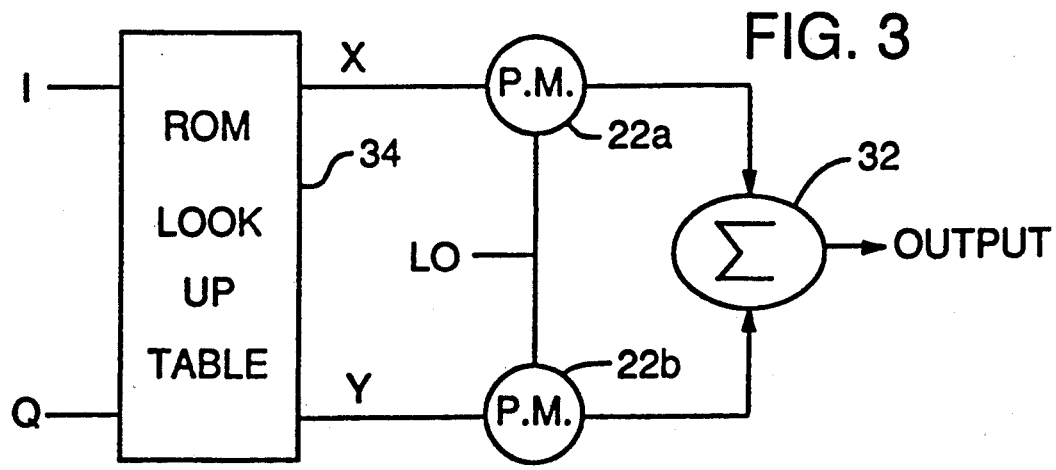
FIG. 3 is a block diagram of an I-Q modulator employing phase-based vector modulation techniques in accordance with the present invention.

The above transformation can be accomplished by a ROM look-up table 34, as shown in FIG. 3. Digital words for I and Q are input to the address lines of the ROM. The corresponding values of X and Y are stored in the ROM and are provided on the output lines. This function can alternatively be accomplished by using a dedicated signal processor that calculates X and Y according to the foregoing formulas.

The phase modulators 22 in the illustrated system may be of the type that respond to analog input modulation signals, in which case digital-to-analog converters can be used between the ROM 34 and the modulators. Alternatively, as detailed below, the phase modulators may be of the type that respond to digital input modulation signals, in which case no such conversion stages are necessary.

A significant advantage of the illustrated phase based modulator 20 over the conventional I-Q modulator 10 is that the two component signals $V_a$, $V_b$ applied to the summing network 32 have constant and equal amplitudes, since they have been phase modulated. This characteristic permits non-linear signal processing, such as limiting amplifiers or PLL (sum loop) translation of signals $V_a$, $V_b$ to other frequencies (RF or microwave) prior to summing. In fact, any operation that maintains the phase relationship between these two signals can be performed. Any amplitude distortion can be corrected by a level control circuit at the summing network. In contrast, the conventional I-Q modulator 10 requires linear signal processing due to amplitude modulation of its component signals $V_1$, $V_2$, thereby reducing the utility of such a modulator.

Figure 4:
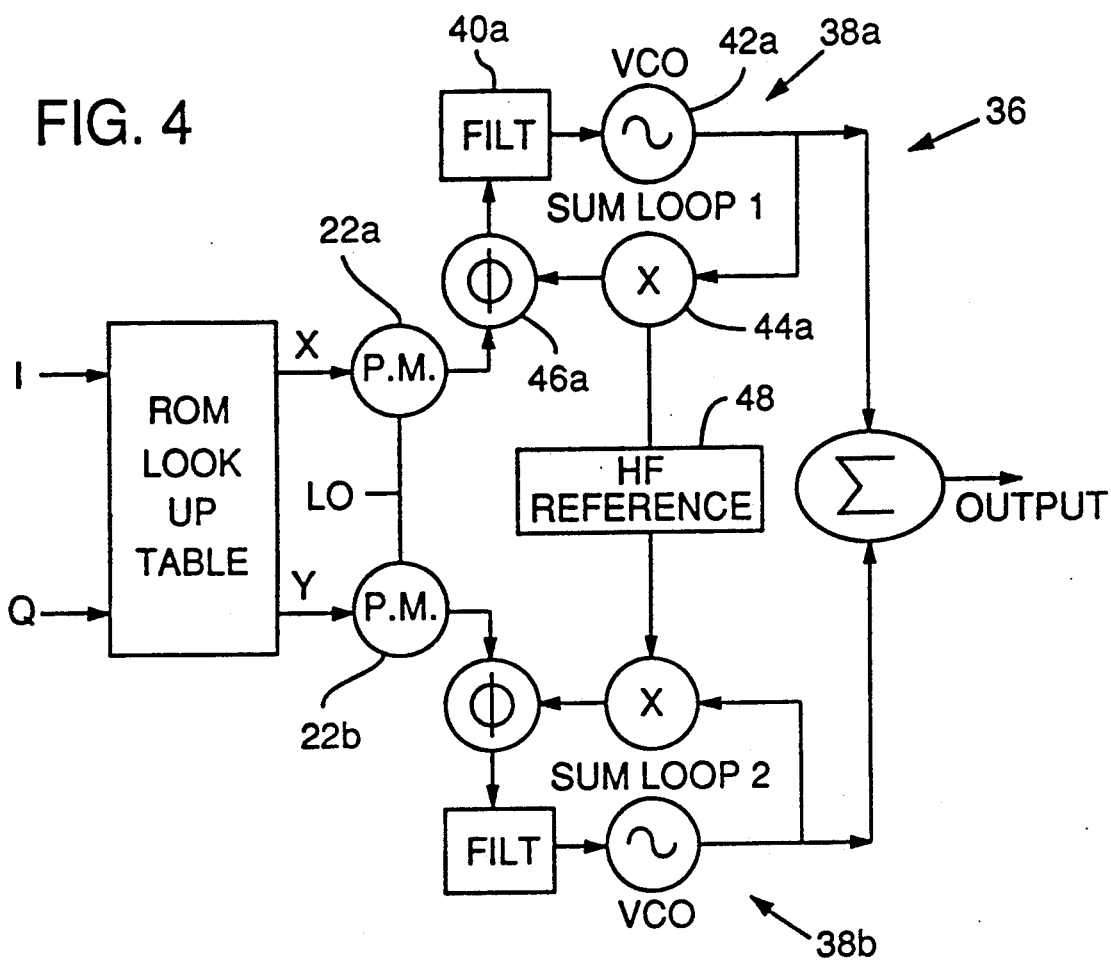
FIG. 4 is a block diagram illustrating phase locked loop frequency translation in a phase-based vector modulator in accordance with the present invention.

FIG. 4 illustrates a representative system 36 for frequency translation using phase locked loops. The phase modulated output from each of modulators 22 is introduced to a sum loop 38. Each sum loop comprises a loop filter 40, a voltage controlled oscillator (VCO) 42, a mixer 44 and a phase detector 46. A reference signal source 48 provides a frequency translation signal to the mixer 44 to be mixed with the VCO output signal.

In operation, the output signal from the mixer 44 is locked, by operation of the loop, to have the same frequency and phase as the input signal from the associated phase modulator 22. Each VCO output signal thus has the same phase characteristics as the corresponding input signal, but is translated in frequency by an amount equal to the reference signal.

The phase detectors 46 can each take one of several forms. One is a simple mixer or multiplier. Another is a dual flip-flop zero crossing detector. In either case, the phase detectors produce spurious high frequency signals as well as the desired phase difference signal (i.e. the sum product and reference oscillator feedthrough in a mixer phase detector, and digital noise in a flip-flop phase detector) that are suppressed by the loop filter 40. The loop filter can also tailor certain dynamic characteristics of the loop, such as lock-up time, etc.

It will be recognized that the phase modulators 22a, 22b of modulator 20 can be implemented in a number of fashions. One is to use a simple PLL. It is well known that the output signal of a PLL can be phase modulated by perturbing its locked state with an analog modulation signal, as disclosed in U.S. Pat. No. 4,546,331. In other techniques, a digital (rather than an analog) modulating signal may be employed.

There are several ways of implementing phase modulation with a digital modulation input. One is to employ a frequency synthesizer, such as a PLL synthesizer, that has a digital frequency control port. If the digital modulation words from the ROM 34 are summed with a frequency control signal applied to this control port, frequency modulation would result. Since phase modulation is the integral of frequency modulation, phase modulation may be achieved by processing the digital modulation words to produce their derivatives, and summing the derivative words at the frequency control port.

Figure 5:
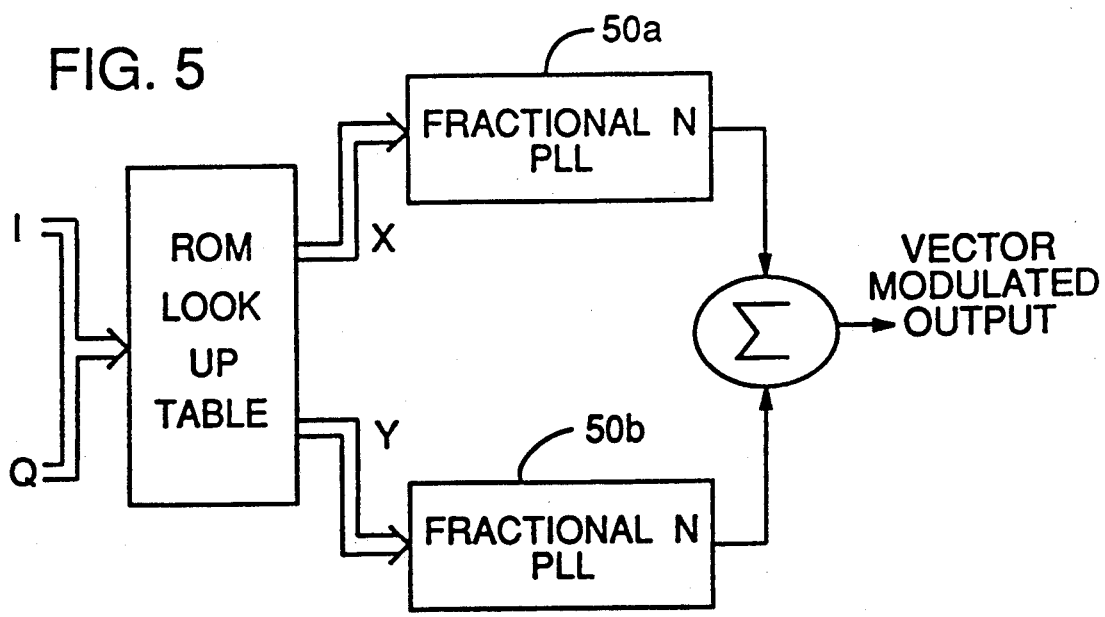
FIG. 5 is a block diagram of a phase-based vector modulator employing fractional-N loops as phase modulators.

Another technique of digital phase modulation—one which permits the digital X and Y words to be applied directly from the ROM 34 to the modulators without intervening processing—is to use a fractional-N phase locked loop circuit 50 as a modulator, as shown in FIG. 5. Such circuits are well known in the art, as illustrated by U.S. Pat. Nos. 3,928,813, 4,204,174, 4,686,488, 4,758,802, 4,763,083, 4,800,342, 4,890,071, and 4,918,405. In certain loop topologies there is a signal node that has a digital representation of the instantaneous phase of the output signal. By summing digital modulation words from the ROM into this node, phase modulation of the resulting output signal is achieved.

In all such arrangements, the two PLLs or synthesizers need to be locked to the same reference signal but may have an arbitrary, fixed phase offset ("A", FIG. 2) between them. Any such offset can be reflected in the data, computed by equations (21), (22) stored in the ROM 34.

As noted, the component phase modulated signals $V_a$, $V_b$ may be processed in any manner that maintains their original phase characteristics. If the processing alters the amplitude balance between the signals, this balance may be restored by using a level control circuit, such as circuit 52 of FIG. 6.

Figure 6:
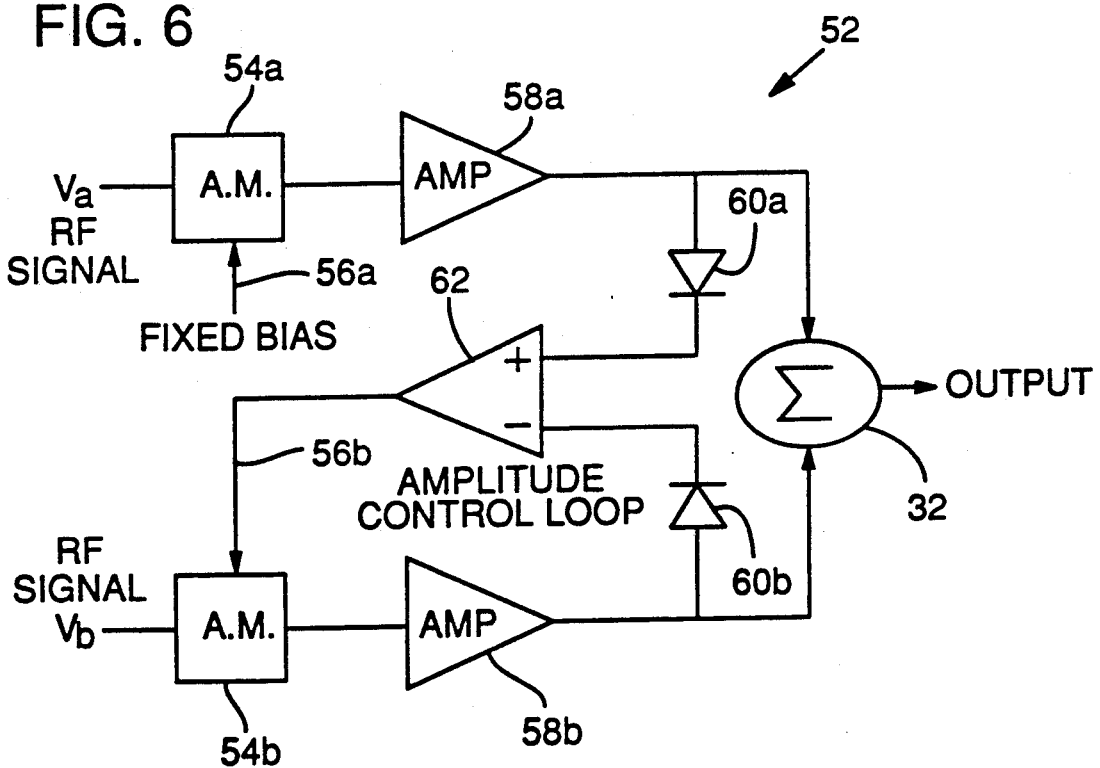
FIG. 6 is a block diagram of an amplitude control circuit for use with a phase-based vector modulator in accordance with the present invention.

In the FIG. 6 circuit 52, each signal $V_a$ and $V_b$ is first provided to an amplitude modulator 54 that varies the amplitude of the signal in response to a control signal applied to a control port 56 thereof. The output signal is provided to an amplifier 58. The output from the amplifier is applied to the summing network 32.

Amplitude detectors 60a and 60b sample the outputs of amplifiers 58a, 58b and provide signals to a differential amplifier 62. The output of this amplifier drives the control port 56b of the amplitude modulator 54b. (A fixed bias signal is applied to the other control port 56a.) The circuit 52 servos the gain of the amplitude modulator 54b to maintain amplitude balance between the two signals applied to the summing network 32.

Having described and illustrated the principles of our invention with reference to a preferred embodiment, it will be apparent that the invention can be modified in arrangement and detail without departing from such principles. For example, while the invention has been illustrated with reference to an embodiment in which the phase modulators comprise fractional-N phase locked loops, in other embodiments the phase modulators can comprise direct digital synthesizers. Such synthesizers are well known in the art, as illustrated by U.S. Pat. Nos. 4,809,205, 4,878,035, 4,926,130 and 4,933,890, and by foreign patent publications EP 338,742A, JP 1,090,611, GB 2,121,627, and DE 3,829,985A. Similarly, while the invention has been illustrated with reference to a modulator that uses I and Q signals as input signals, it will be recognized that in alternative embodiments the input signals may take the form of magnitude and phase data.

In view of the many possible embodiments to which the principles of our invention may be put, it should be recognized that the detailed embodiments are illustrative only and should not be taken as limiting the scope of our invention. Rather, we claim as our invention all such embodiments as may come within the scope and spirit of the following claims and equivalents thereto.

We claim:

1. In a vector modulation system in which a vector modulated output signal is produced by summing component signals produced by first and second circuits in response to first and second input modulation signals, an improvement wherein the first and second circuits comprise continuously variable phase modulators, so that any form of amplitude, phase or frequency modulation can be generated.

2. In a vector modulation system in which a vector modulated output signal is produced by summing component signals produced by first and second circuits in response to first and second input modulation signals, an improvement wherein the first and second circuits comprise phase modulators and each of the phase modulators comprises a phase locked loop.

3. In a vector modulation system in which a vector modulated output signal is produced by summing component signals produced by first and second circuits in response to first and second input modulation signals, an improvement wherein the first and second circuits comprise phase modulators and each of the phase modulators comprises a direct digital synthesizer.

4. In a vector modulation system in which a vector modulated output signal is produced by summing component signals produced by first and second circuits in response to first and second input modulation signals, an improvement wherein the first and second circuits comprise phase modulators and each of the phase modulators comprises a fractional-N phase locked loop.

5. The system of claim 4 in which each fractional-N phase locked loop includes a digital modulation input port, and in which the loop is responsive to digital words applied to said input port to modulate the phase of a loop output signal.

6. A vector modulator capable of generating any form of amplitude, phase or frequency modulation, the modulator comprising:
   a source of local oscillator signals;
   a summing network having first and second inputs and an output; and
   a first continuously variable phase modulator having a first input coupled to the source of local oscillator signals, a second input for receiving a first modulation signal, and an output coupled to the first input of the summing network;
   a second continuously variable phase modulator having a first input coupled to the source of local oscillator signals, a second input for receiving a second modulation signal, and an output coupled to the second input of the summing network;
   input means for receiving vector signals; and
   a processor for altering said vector signals and producing the first and second modulation signals therefrom.

7. A vector modulator comprising:
   a source of local oscillator signals;
   a summing network having first and second inputs and an output; and
   a first phase modulator having a first input coupled to the source of local oscillator signals, a second input for receiving a first modulation signal, and an output coupled to the first input of the summing network;
   a second phase modulator having a first input coupled to the source of local oscillator signals, a second input for receiving a second modulation signal, and an output coupled to the second input of the summing network;
   input means for receiving quadrature I and Q signals; and
   a processor for altering said quadrature I and Q signals and producing the first and second modulation signals therefrom, said processor producing said first and second modulation signals (X and Y) by altering the quadrature I and Q signals according to the following formulas:

$$X = \tan^{-1}(Q/I) - \cos^{-1}(SQRT(I^2+Q^2)/2)$$

$$Y = \tan^{-1}(Q/I) - A + \cos^{-1}(SQRT(I^2+Q^2)/2)$$

where A is an arbitrary phase term reflecting a phase offset.

8. A vector modulator comprising:
a source of local oscillator signals;
a summing network having first and second inputs and an output; and
a first phase modulator having a first input coupled to the source of local oscillator signals, a second input for receiving a first modulation signal, and an output coupled to the first input of the summing network;
a second phase modulator having a first input coupled to the source of local oscillator signals, a second input for receiving a second modulation signal, and an output coupled to the second input of the summing network;
input means for receiving vector signals; and
a processor for altering said vector signals and producing the first and second modulation signals therefrom, said processor including a memory responsive to vector signals applied thereto to produce corresponding first and second modulation data signals.

9. A vector modulation apparatus capable of generating any form of amplitude, phase or frequency modulation comprising:
first means for receiving first and second vector signals;
second means coupled to the first means for producing first and second output signals (X and Y) corresponding to the first and second vector signals;
a local oscillator;
a first continuously variable phase modulator responsive to the first output signal (X) from the second means and responsive to the local oscillator, for producing a first phase modulated output signal;
a second continuously variable phase modulator responsive to the second output signal (Y) from the second means and responsive to the local oscillator, for producing a second phase modulated output signal; and
a combiner having first and second inputs coupled to outputs of the first and second phase modulators, and having an output for outputting a summed output signal.

10. The apparatus of claim 9 in which the first and second phase modulators each comprises a phase locked loop.

11. The apparatus of claim 9 which further includes:
a signal source for producing a reference signal;
first and second phase locked loops associated with the first and second phase modulators, respectively, each of said loops having an input for receiving a phase modulated signal from the modulator associated therewith, each of said loops further including a loop filter, a voltage controlled oscillator, and a frequency translator in series-coupled arrangement, the frequency translator having an input for receiving the reference signal from the signal source; and in which the combiner has its first and second inputs coupled to outputs of the voltage controlled oscillators in the first and second loops, respectively.

12. The apparatus of claim 9 in which:
the first phase modulator comprises a fractional-N phase locked loop, said loop having an input coupled to the second means for receiving therefrom the first output signal (X) and including means for responding to said output signal by effecting a proportional phase deviation of a first loop output frequency; and
the second phase modulator comprises a fractional-N phase locked loop, said loop having an input coupled to the second means for receiving therefrom the second output signal (Y) and including means for responding to said output signal by effecting a proportional phase deviation of a second loop output frequency.

13. The apparatus of claim 9 which further comprises a level control circuit interposed between the phase modulators and the combiner, the level control circuit comprising:
first and second level detector circuits;
a differential amplifier having inputs coupled to said level detector circuits and having an output;
an amplifier serially interposed with one of the first or second combiner inputs, said amplifier having a gain control input coupled to the output of the differential amplifier.

14. A method of using phase modulation to generate a signal with any amplitude, phase or frequency characteristics, the method comprising the steps:
providing vector signals;
determining X and Y signals corresponding to said vector signals;
continuously phase modulating a first local oscillator signal with the X signal to produce a first output signal;
continuously phase modulating a second local oscillator signal with the Y signal to produce a second output signal, said second local oscillator signal having the same frequency as the first local oscillator signal; and
summing the first and second output signals.

15. The method of claim 14 in which the vector signals are quadrature I and Q signals, and the determining steps comprise producing X and Y signals according to the following equations:

$$X = \tan^{-1}(Q/I) - \cos^{-1}(SQRT(I^2+Q^2)/2)$$

$$Y = \tan^{-1}(Q/I) - A + \cos^{-1}(SQRT(I^2+Q^2)/2)$$

where A is an arbitrary phase term reflecting a phase offset.

16. The method of claim 15 in which the determining step includes addressing a memory with the I and Q signals and retrieving from the memory X and Y signals corresponding thereto.

17. The method of claim 15 in which the determining step includes calculating X and Y according the aforesaid equations using a signal processor.

* * * * *